United States Patent [19]  [11] Patent Number: 4,856,106
Teraoka  [45] Date of Patent: Aug. 8, 1989

[54] SYNCHRONOUS STATIC RANDOM ACCESS MEMORY HAVING PRECHARGE SYSTEM AND OPERATING METHOD THEREOF

[75] Inventor: Eiichi Teraoka, Hyogo, Japan

[73] Assignee: Mitsubishi Denki Kabushiki Kaisha, Tokyo, Japan

[21] Appl. No.: 230,343

[22] Filed: Aug. 9, 1988

[30] Foreign Application Priority Data

Aug. 19, 1987 [JP] Japan ................................ 62-206865

[51] Int. Cl.4 ........................................... G11C 11/40
[52] U.S. Cl. ................................ 365/203; 365/189.11
[58] Field of Search ...................... 365/203, 189, 230

[56] References Cited

U.S. PATENT DOCUMENTS 4,788,457 11/1988 Mashiko et al. .................... 365/203

FOREIGN PATENT DOCUMENTS 254193 12/1984 Japan .
256997 12/1985 Japan .

Primary Examiner—Terrell W. Fears
Attorney, Agent, or Firm—Lowe, Price, LeBlanc, Becker & Shur

[57] ABSTRACT

A plurality sets of bit line pairs are connected to one set of common data line pair respectively through bit line selecting transistors. The common data line pair is coupled to the supply potential through precharging transistors. In the precharging period, a set of bit line pair is selected by a Y decoder to be connected to the common data line pair. On this occasion, the precharging transistor turns on in response to a precharge signal and the selected bit line pair is precharged through the common data line pair. The bit line pair which is not selected is not precharged.

12 Claims, 9 Drawing Sheets

SYNCHRONOUS STATIC RANDOM ACCESS MEMORY HAVING PRECHARGE SYSTEM AND OPERATING METHOD THEREOF

BACKGROUND OF THE INVENTION

1. Field of the Invention

The present invention relates generally to a synchronous static random access memory devices and, more specifically, to a synchronous static random access memory devices in which a bit line is precharged during a precharging period before data reading is carried out.

2. Description of the Prior Art

FIG. 1 is a schematic block diagram showing a whole structure of one example of a synchronous SRAM (static random access memory) device in which operation is carried out in synchronization with a clock signal, and FIG. 2 shows a structure of one portion of a memory cell array in the SRAM device of FIG. 1.

As shown in FIG. 2, in the memory cell array 1 of FIG. 1, a plurality sets of bit line pairs BL, $\overline{BL}$ and a plurality of word lines WL are arranged intersecting with each other and a static type memory cell MC is provided at each intersection of these lines. The plurality of word lines WL are connected to a X decoder 2. The X decoder 2 receives address signals $AD_1$ to $AD_i$ and selects one out of the plurality of word lines WL to raise the potential thereof to a "H" level. In the example of FIG. 1, one set of common data line pair CDL, $\overline{CDL}$ and one sense amplifier 4 are provided for every two sets of bit line pairs BL, $\overline{BL}$. The two sets of the bit line pairs BL, $\overline{BL}$ are connected to the common data line pair CDL, $\overline{CDL}$ through bit line selecting transistors Q1 and Q2 or bit line selecting transistors Q3 and Q4. The sense amplifier 4 is connected between each common data line pair CDL, $\overline{CDL}$. A bit line select signal CL1 is applied to the gates of the transistors Q1 and Q2 from a Y decoder 3 and a bit line select signal CL2 is applied to the gates of the transistors Q3 and Q4 from the Y decoder 3. The Y decoder 3 receives an address signal $AD_{i+1}$ and raises either the bit line select signal CL1 or CL2 to the "H" level.

As shown in FIG. 2, each bit line pair BL, $\overline{BL}$ is coupled to the supply potential $V_{CC}$ through precharging transistors Q5 and Q6, respectively. A precharge signal PR is applied to the gates of the transistors Q5 and Q6. In reading data from the memory cell MC, the potential of the bit lines BL and $\overline{BL}$ should be higher than a prescribed level, otherwise a read error is generated. Therefore, in this SRAM device, a bit line precharging system is employed in which the bit lines BL and $\overline{BL}$ are precharged to a prescribed potential in the precharging period before data reading from the memory cell MC.

The reading operation of the SRAM device will be described in the following. First, when the precharge signal PR becomes "H" level, the precharging transistors Q5 and Q6 turn on. Consequently, the potential of all bit line pairs BL, $\overline{BL}$ is precharged to $V_{CC}-V_{TH}$. Here, $V_{TH}$ is the threshold voltage of the transistors Q5 and Q6. After the transistors Q5 and Q6 are turned off, the X decoder 2 selects one of the word lines WL in response to the address signals $AD_1$ to $AD_i$ to raise the potential thereof to the "H" level. Consequently, the data stored in each of the memory cells MC connected to that word line is read to each of the bit lines BL or $\overline{BL}$, whereby the potential of one of the bit line pair BL, $\overline{BL}$ falls. Thereafter, the Y decoder 3 raises either the bit line select signal CL1 or CL2 to the "H" level in accordance with the address signal $AD_{i+1}$. When the bit line select signal CL1 becomes "H" level, for example, the transistors Q1 and Q2 turn on and the data on the bit lines BL and $\overline{BL}$ connected to the transistors Q1 and Q2 are read on the common data line pair CDL and $\overline{CDL}$. Thereafter, the data on CDL and $\overline{CDL}$ are amplified by the sense amplifier 4 to be outputted. In this manner, the data $DQ_1$ to $DQ_n$ are outputted from the memory cell array 1.

The above described synchronous type semiconductor memory device is disclosed in, for example, Japanese Patent Laying-Open Gazette No. 256997/1985, filed on June 1, 1984 by Hitachi, Ltd. and in Japanese Patent Laying-Open Gazette No. 133094/1986, filed on Dec. 3, 1984 by Oki Electric Industry Co., Ltd. and so on.

In the conventional synchronous type semiconductor memory device shown in FIGS. 1 and 2, all bit line pairs BL, $\overline{BL}$ are precharged through the precharging transistors Q5 and Q6 in the precharging period before data reading. More specifically, in FIG. 1, for example, when the bit line pair BL, $\overline{BL}$ connected to the bit line selecting transistors Q1 and Q2 is selected by the bit line select signal CL1, the precharge and data reading are also carried out for the bit line pair BL, $\overline{BL}$ connected to the bit line selecting transistors Q3 and Q4. Therefore, unnecessary precharging and discharging are carried out for the non-selected bit line pair BL, $\overline{BL}$, presenting an obstacle in reducing power consumption.

In some cases, as shown in FIG. 3, precharging transistors are provided for each common data line pair CDL, $\overline{CDL}$ besides the bit line precharging transistors. However, in this case also, unnecessary precharging and discharging are carried out for the non-selected bit line pair BL, $\overline{BL}$.

Now, the differences between a synchronous SRAM and an asynchronous SRAM will be described with reference to FIGS. 4A, 4B, 5A and 5B.

FIG. 4A shows a synchronous SRAM, and FIG. 4B is a timing chart for describing the operation of the synchronous SRAM. As shown in FIGS. 4A and 4B, in the synchronous SRAM, when a synchronous signal $\phi s$ is at "H" level, that is, in a precharge period a bit line pair BL, $\overline{BL}$ and an input/output line pair I/O, $\overline{I}/$ are precharged to a prescribed level through precharge transistors Q25 and Q26 and precharge transistors Q27 and Q28, respectively. At that time, although address signals are applied to an X decoder 22 and a Y decoder 23, a word line WL is not driven so that data stored in a memory cell MC is not read out on the bit line pair BL, $\overline{BL}$.

On the other hand, when the synchronous signal $\phi s$ is at "L" level, the word line WL is driven by the X decoder 22 so that data stored in the memory cell MC is read out on the bit line pair BL, $\overline{BL}$ and input/output line pair I/O, $\overline{I}/$.

As described above, data is read out in synchronization with the synchronous signal in the synchronous SRAM. Additionally, since the precharge transistors Q25 to Q28 is turned off in a reading period, a large difference appears between potential levels of the bit lines BL and $\overline{BL}$.

FIG. 5A shows an asynchronous SRAM, and FIG. 5B is a timing chart for describing the operation of the asynchronous SRAM.

As shown in FIGS. 5A and 5B, a synchronous signal is not applied. In the asynchronous SRAM, a memory cell MC is selected in response to inputted address signals, so that the data stored in the memory cell MC is read out on a bit line pair BL, $\overline{BL}$ and an input/output line pair I/O, $\overline{I/}$. Therefore, the read data is asynchronously outputted in response to change of the address signals.

Additionally, since transistors Q29 to Q32 connected to the bit line pair BL, $\overline{BL}$ and the input/output line pair I/O, $\overline{I/}$ are always turned on, a sufficient difference is not obtained between the potential levels of the bit lines BL and $\overline{BL}$ when data is read out from the memory cell MC.

SUMMARY OF THE INVENTION

An object of the present invention is to provide a synchronous SRAM device of low power consumption.

Another object of the present invention is to provide a synchronous SRAM device in which power consumption in the bit line precharging period is reduced.

A further object of the present invention is to provide a synchronous SRAM device in which precharging is carried out only on the bit line selected for data reading out of a plurality of bit lines.

A further object of the present invention is to provide an operating method of a synchronous SRAM of low power consumption.

In order to attain the above described objects, the SRAM in accordance with the present invention comprises: a plurality of word lines; a plurality of bit line pairs arranged so as to intersect the plurality of word lines; a plurality of memory cells at intersections of the word lines and the bit lines for storing information; a common data line pair; first selection means for selecting any of the plurality of bit lines; a source of precharge voltage at the common data line pair; and switch means for connecting the common data line pair to only the selected bit line pair and establishing a unidirectional precharge current flow path between the common data line pair and the selected bit line pair, the unidirectional precharge current flow path carrying precharge current only from the source at the common data line pair to the selected bit line pair.

In the synchronous SRAM device in accordance with the present invention, a bit line from which the data should be read is selected by the first selection means to be connected to the common data line, and the selected bit line is precharged by the source of precharge voltage through the common data line. Therefore, only the bit line from which the data should be read is precharged, and other bit lines are not precharged, whereby the power consumption can be reduced.

These objects and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will be hereinafter described with reference to the figures.

Figure 1:
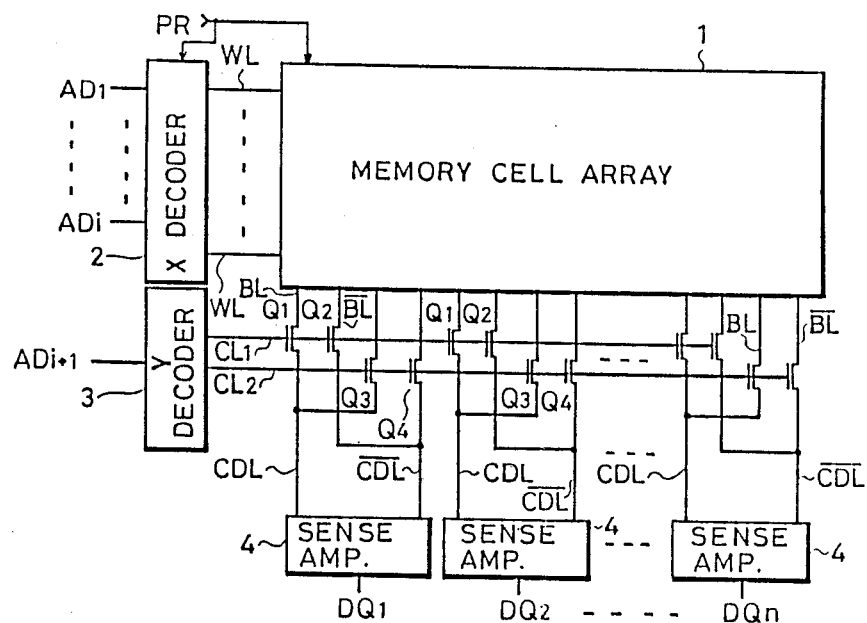
FIG. 1 is a schematic diagram showing a structure of one example of a conventional synchronous SRAM device.
Figure 2:
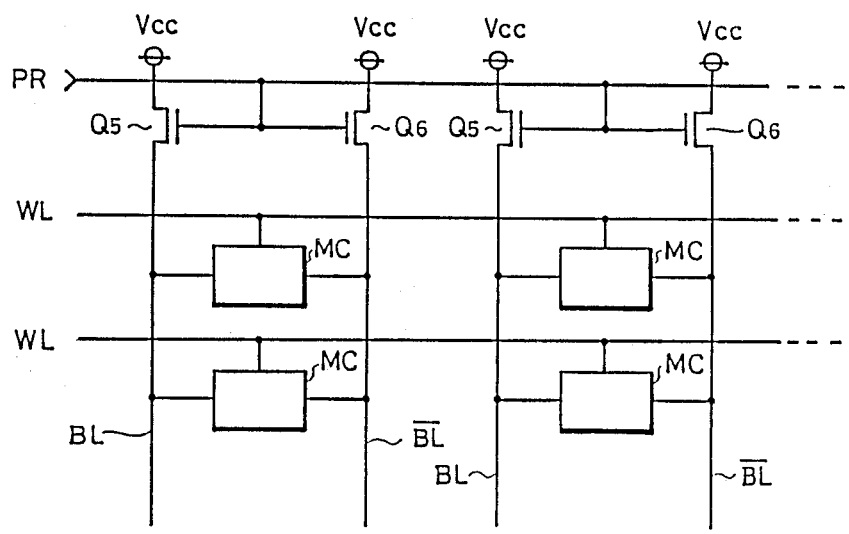
FIG. 2 shows a structure of one portion of a memory cell array in the SRAM device shown in FIG. 1.
Figure 3:
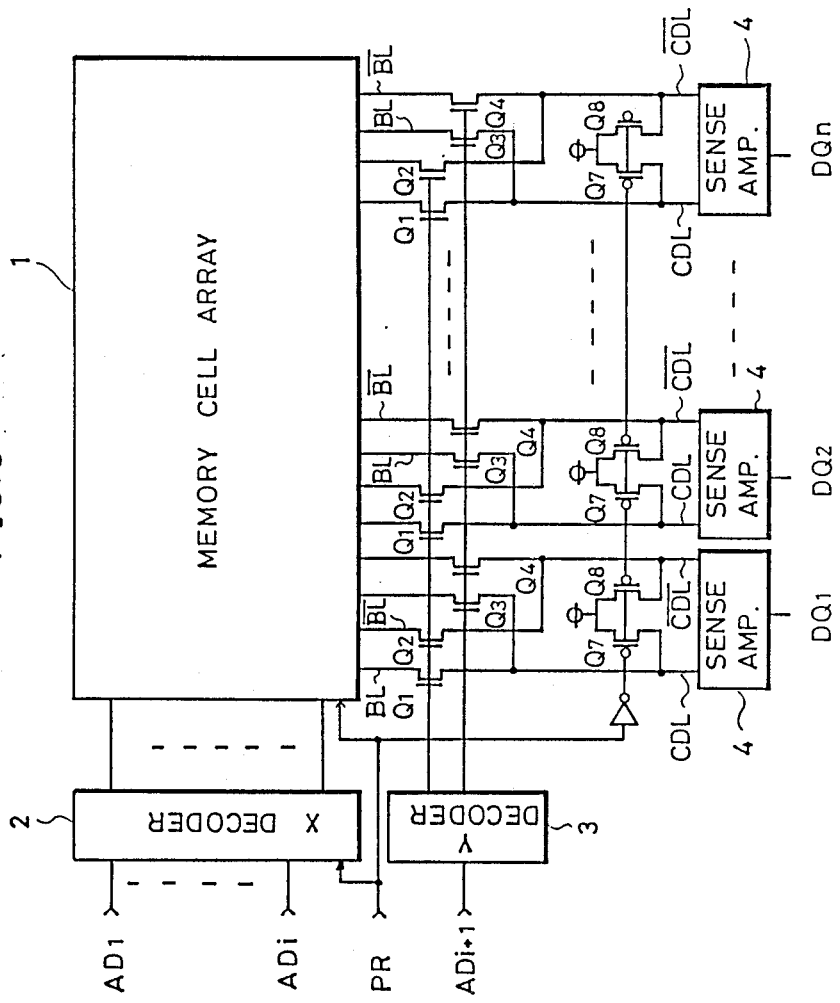
FIG. 3 shows a schematic diagram showing a structure of another example of a conventional synchronous SRAM device.
Figure 4A:
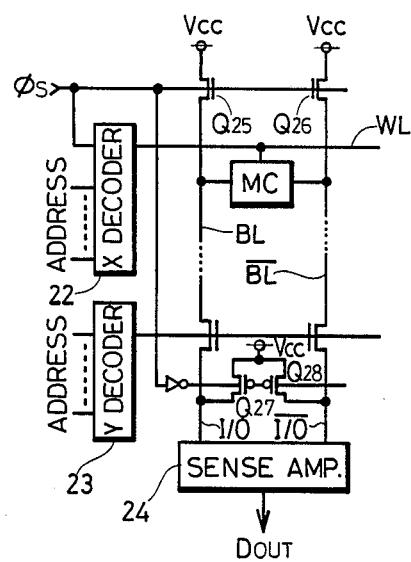
FIG. 4A shows a structure of a synchronous SRAM.
Figure 4B:
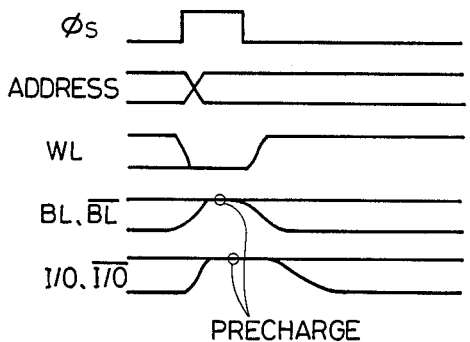
FIG. 4B is a timing chart for describing the operation of the synchronous SRAM shown in FIG. 4A.
Figure 5A:
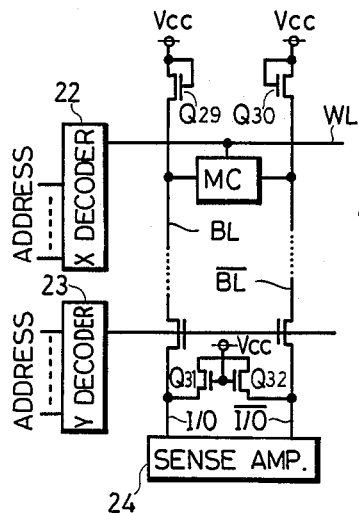
FIG. 5A shows a structure of an asynchronous SRAM.
Figure 5B:
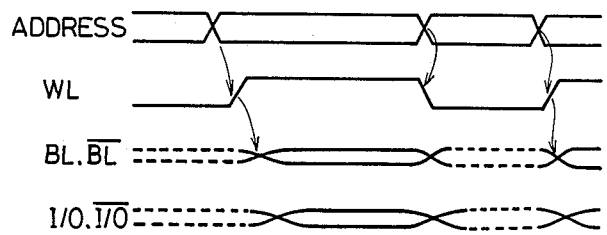
FIG. 5B is a timing chart for describing the operation of the asynchronous SRAM shown in FIG. 5B.
Figure 6:
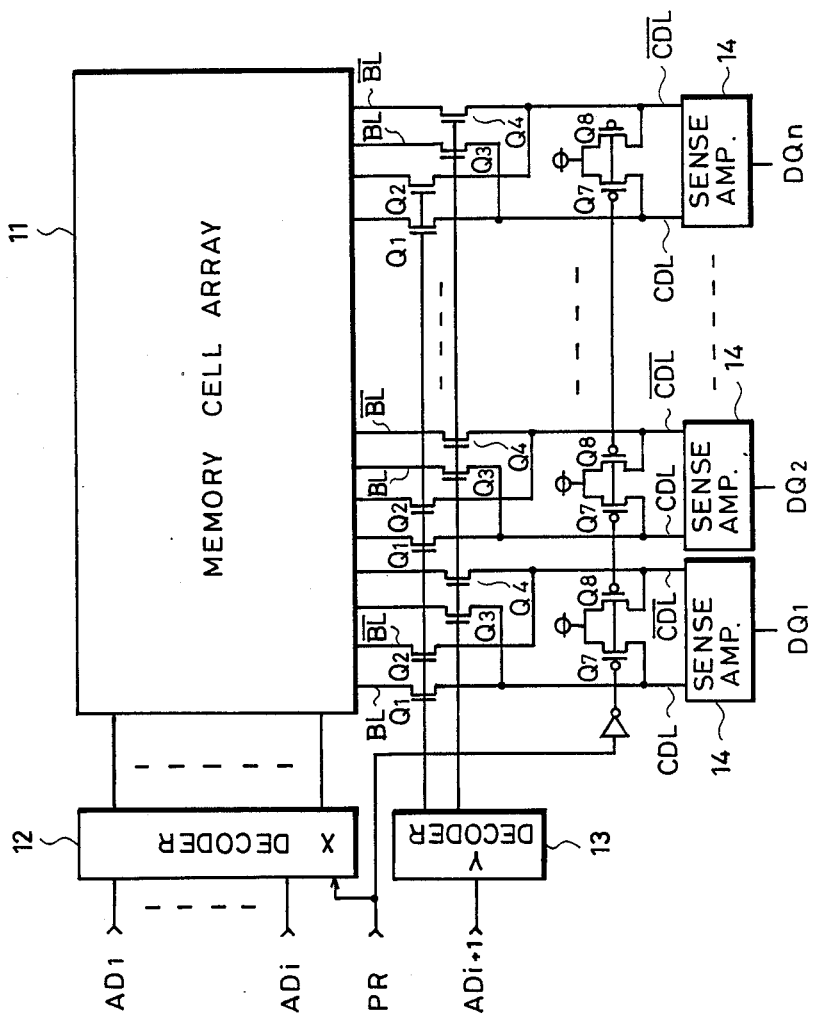
FIG. 6 is a schematic diagram showing a structure of a synchronous SRAM device in accordance with one embodiment of the present invention.
Figure 7:
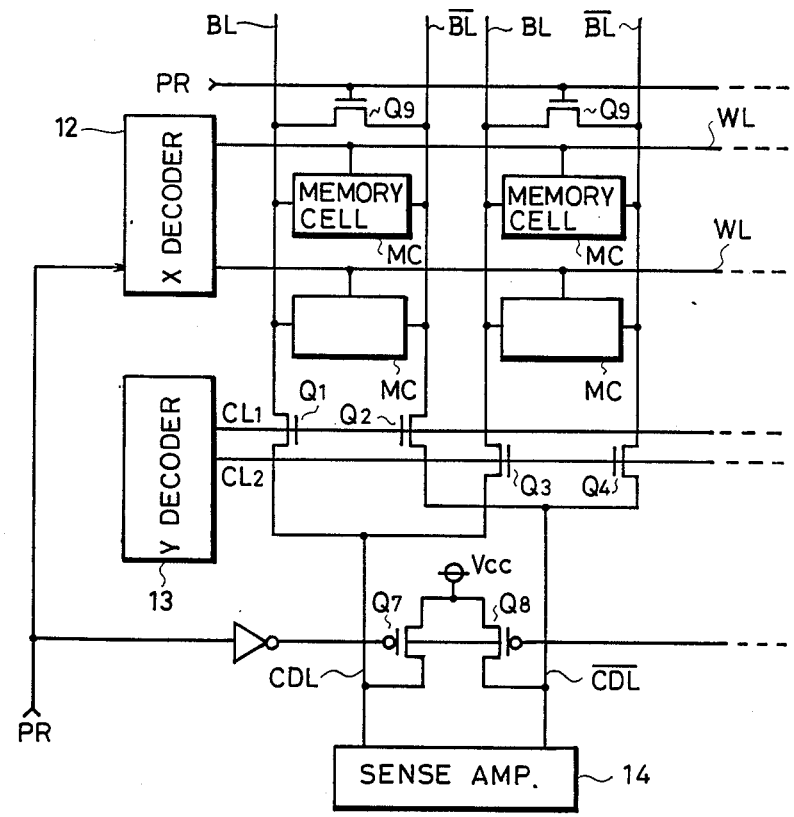
FIG. 7 shows a structure of one portion of a memory cell array in the SRAM device shown in FIG. 6.

FIG. 6 shows a structure of a synchronous SRAM device in accordance with one embodiment of the present invention, and FIG. 7 shows a structure of a main portion of a memory cell array in the SRAM device in FIG. 6.

As shown in FIG. 7, in the memory cell array 11 of FIG. 6, a plurality sets of bit line pairs BL, $\overline{BL}$ and a plurality of word lines WL are arranged intersecting with each other and a memory cell MC is provided at each of the intersections of these lines. In FIG. 7, only two word lines WL and two sets of bit line pairs BL, $\overline{BL}$ are shown. The plurality of word lines WL are connected to a X decoder 12. The X decoder 12 receives address signals $AD_1$ to $AD_i$ and selects one of the plurality of word lines WL to raise the potential thereof to the "H" level. In the embodiment of FIG. 6, a set of common data line pair CDL, $\overline{CDL}$ and one sense amplifier 14 are provided for every two sets of bit line pairs BL, $\overline{BL}$. The two sets of bit line pairs BL, $\overline{BL}$ are connected to the same common data line pair CDL, $\overline{CDL}$ through the bit line selecting transistors Q1, Q2 and bit line selecting transistors Q3, Q4, respectively. A bit line select signal CL1 is applied to the gates of the transistors Q1 and Q2 from a Y decoder 13 and a bit line select signal CL2 is applied to the gates of the transistors Q3 and Q4 from the Y decoder 13. The Y decoder 13 receives an address signal $AD_{i+1}$ and raises either the bit line select signal CL1 or CL2 to the "H" level.

A sense amplifier 14 is connected between each common data line pair CDL, $\overline{CDL}$ for amplifying the potential difference between these lines. In addition, the common data lines CDL and $\overline{CDL}$ are connected to the supply potential $V_{CC}$ through the precharging transistors Q7 and Q8, respectively. A precharge signal PR is applied to the gates of the transistors Q7 and Q8. As shown in FIG. 7, an equalizing transistor Q9 is connected between each bit line pair BL, $\overline{BL}$ and a precharge signal PR is applied to the gate of the equalizing transistor Q9. Meanwhile, the transistors Q1 to Q4 and Q9 are N channel MOS transistors, and transistors Q7 and Q8 are P channel MOS transistors.

Figure 8:
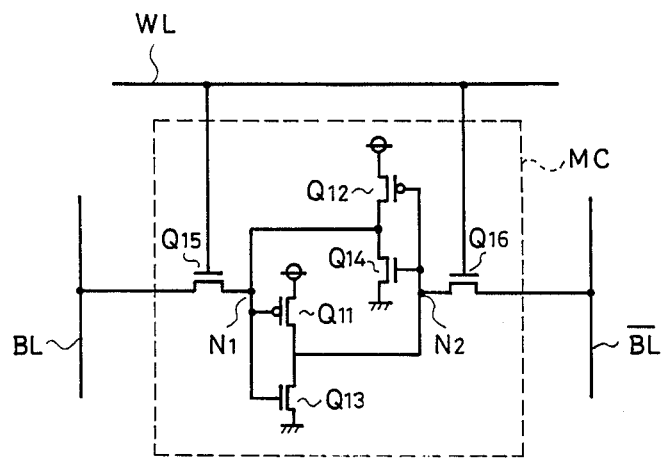
FIG. 8 shows one example of a circuit structure of the memory cell shown in FIGS. 6 and 7.

FIG. 8 shows a structure of one example of the memory cell MC. The memory cell MC is a CMOS static type memory cell comprising P channel MOS transistors Q11 and Q12 and N channel MOS transistors Q13 and Q14. An inverter constituted by the transistors Q11 and Q13 and an inverter constituted by the transistors Q12 and Q14 are connected in reverse parallel between nodes N1 and N2. The node N1 is connected to the bit line BL through an N channel MOS transistor Q15 for accessing while the node N2 is connected to the bit line $\overline{BL}$ through an N channel MOS transistor Q16 for accessing. The gates of the transistors Q15 and Q16 are connected to the word line WL. Now, let us assume that the data of "H" level is stored in the node N1, for example. On this occasion, the data of "L" level is stored in the node N2. When the potential of the word line WL rises to the "H" level, the transistors Q15 and Q16 turn on. If the bit lines BL and $\overline{BL}$ have been precharged to a prescribed "H" level in advance, then a current flows from the bit line $\overline{BL}$ to the ground potential through the transistors Q16 and Q13, so that the potential of the bit line $\overline{BL}$ becomes low. When the data of the "L" level is stored in the node N1 and the data of the "H" level is stored in the node N2, the potential of the bit line BL lowers in the similar manner.

Figure 9:
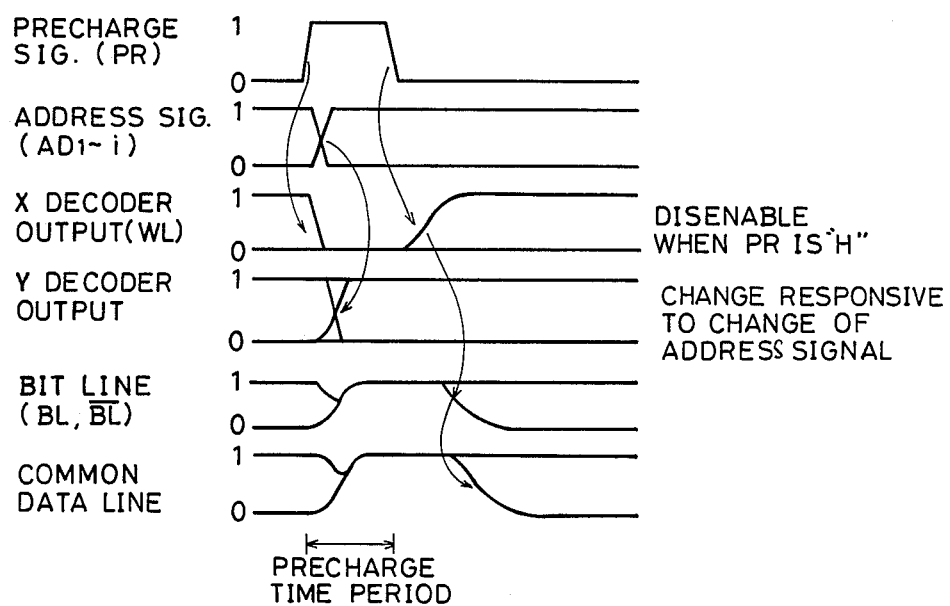
FIG. 9 is a timing chart for describing the operation of the SRAM shown in FIGS. 6 and 7.

The operation of the SRAM device shown in FIGS. 6 and 7 will be described in the following with reference to the timing chart of FIG. 9.

When the precharge signal PR rises to the "H" level, the precharging transistors Q7 and Q8 turn on correspondingly, and the equalizing transistors Q9 turns on. Consequently, the common data line pairs CDL, $\overline{CDL}$ are precharged to a prescribed potential ($V_{CC}$ level). On this occasion, the Y decoder 13 raises one of the bit line select signals CL1 and CL2 from the "L" level to the "H" level. For example, if the bit line select signal CL1 becomes the "H" level, the bit line selecting transistors Q1 and Q2 turn on so that the corresponding one set of bit line pair BL, $\overline{BL}$ is connected to the common data line pair CDL, $\overline{CDL}$. Therefore, the set of the bit line pair BL, $\overline{BL}$ is precharged through the transistors Q1 and Q2, the common data line pair CDL, $\overline{CDL}$ and transistors Q7 and Q8.

On this occasion, since the bit line select signal CL2 remains at the "L" level, the bit line selecting transistors Q3 and Q4 are not turned on. Therefore, the corresponding other sets of bit line pairs BL, $\overline{BL}$ are not connected to the common data line pair CDL, $\overline{CDL}$, so that precharging is not carried out. Meanwhile, in the precharging period in which the precharge signal PR is at the "H" level, the X decoder 12 sets all word lines WL at the non-active state ("L" level).

As described above, in the precharging period, the equalizing transistor Q9 is turned on and the potential of the bit lines BL and $\overline{BL}$ is equalized, so that the rewriting of the memory cell data due to the potential difference between the bit line pair BL, $\overline{BL}$ can be prevented in data reading after the completion of the precharge period.

When the precharge signal PR falls, the X decoder correspondingly selects any word line WL to raise the potential thereof to the "H" level. Consequently, the data are read to respective bit line pairs BL, $\overline{BL}$ from the memory cells MC connected to that word line WL and the potential of the bit line from which the data of "L" level have been read lowers. The potential difference between the bit line pair BL, $\overline{BL}$ connected to the common data line pair CDL, $\overline{CDL}$ is amplified by the sense amplifier 14 to be taken out as the output data. In this manner, the output data $DQ_1$ to $DQ_n$ are taken out from the memory cell array 11 of FIG. 6.

In the above described embodiment, precharging is carried out only on the bit line pairs BL, $\overline{BL}$ which are selected by the Y decoder 13 and not on the non-selected bit line pairs BL, $\overline{BL}$, whereby the power consumption can be reduced.

Figure 10:
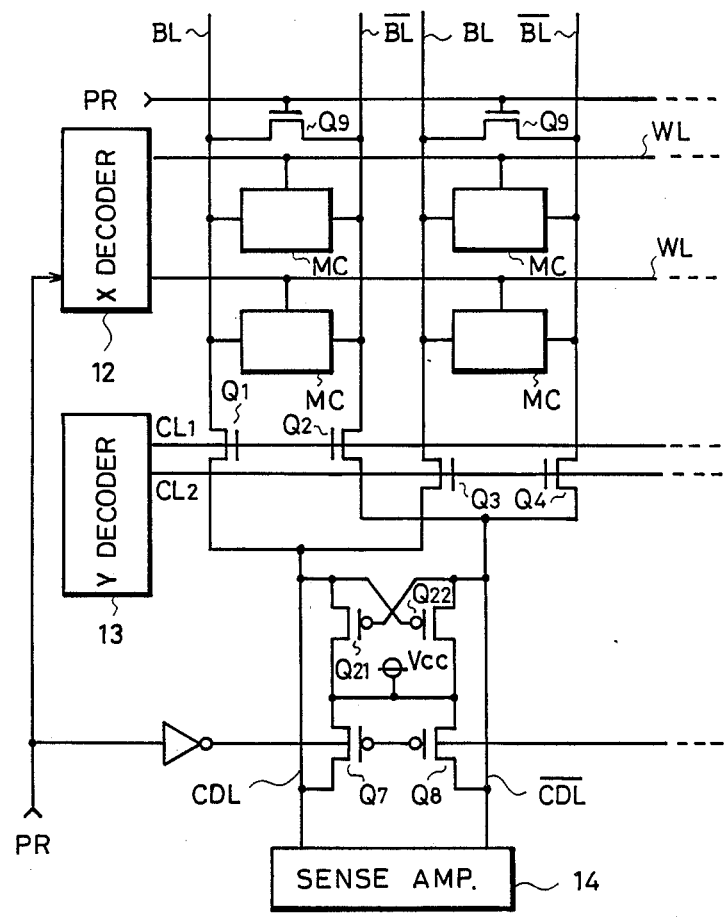
FIG. 10 shows a structure of a main portion of a synchronous SRAM device in accordance with another embodiment of the present invention.

FIG. 10 shows a structure of a main portion of a memory cell array of a synchronous SRAM device in accordance with another embodiment of the present invention.

The embodiment of FIG. 10 is the same as the embodiment of FIG. 7 except that level compensating P channel MOS transistors Q21 and Q22 are coupled between the supply potential $V_{CC}$ and the common data line CDL and $\overline{CDL}$, respectively. The gate of the transistor Q21 is connected to the common data line $\overline{CDL}$ while the gate of the transistor Q22 is connected to the common data line CDL.

Figure 11A:
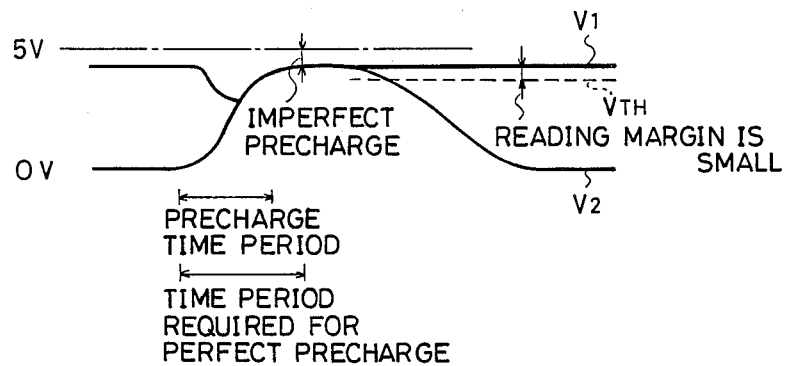
FIGS. 11A, 11B and 11C are diagrams of waveforms for describing the operation of the SRAM device shown in FIG. 10.
Figure 11B:
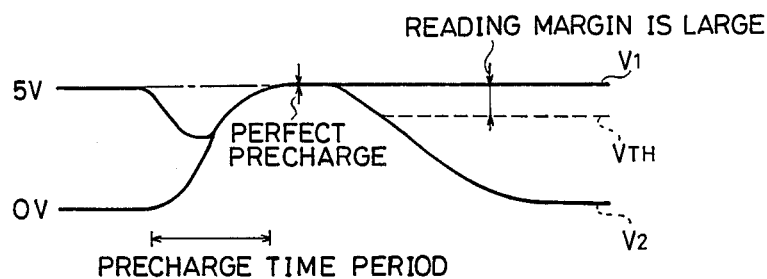

As shown in FIG. 11A, if the data reading is carried out with the bit line being not fully precharged in the precharging period since the precharging period is short and so on, the difference between the level of the potential V1 of the common data line at high potential and the level of the threshold voltage $V_{TH}$ of the sense amplifier 14 becomes smaller compared with the case shown in FIG. 11B in which the bit line is fully precharged. Consequently, the margin of the sense amplifier 14 becomes smaller, and an erroneous data may possibly be read.

Figure 11C:
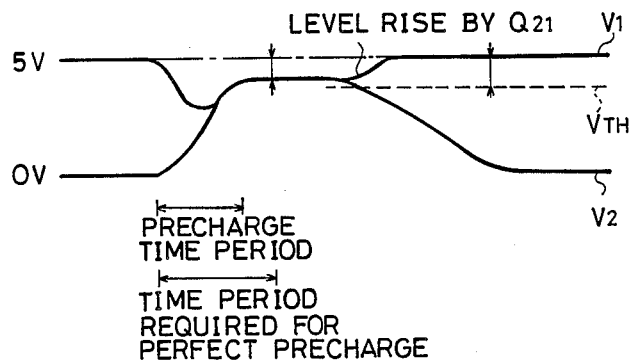

However, in this embodiment, even if the data reading operation is carried out with the precharge of the bit line being imperfect, the level difference between the common data line pair CDL, $\overline{CDL}$ is compensated by the level compensating transistor Q21 or Q22. For example, when the potential of the common data line CDL becomes higher than the potential of the common data line $\overline{CDL}$, the level compensating transistor Q21 turns on. Consequently, the potential of the common data line CDL is pulled up to $V_{CC}$ level, as shown in FIG. 11C, resulting in the same state as the case in which the bit line is fully precharged. Therefore, the sense amplifier 14 does not read any erroneous data. Meanwhile, the reading operation of the SRAM device of this embodiment is the same as the embodiment shown in FIGS. 6 and 7. Therefore, only the bit line pairs BL, $\overline{BL}$ which are selected by the Y decoder 13 is precharged and other bit line pairs BL, $\overline{BL}$ which are not selected are not precharged, whereby the power consumption can be reduced.

Although the equalizing N channel MOS transistor Q9 is provided between each bit line pair BL, $\overline{BL}$ in the embodiments of FIGS. 7 and 10, the equalizing transistor may be provided between each common data line pair CDL, $\overline{CDL}$.

Figure 12:
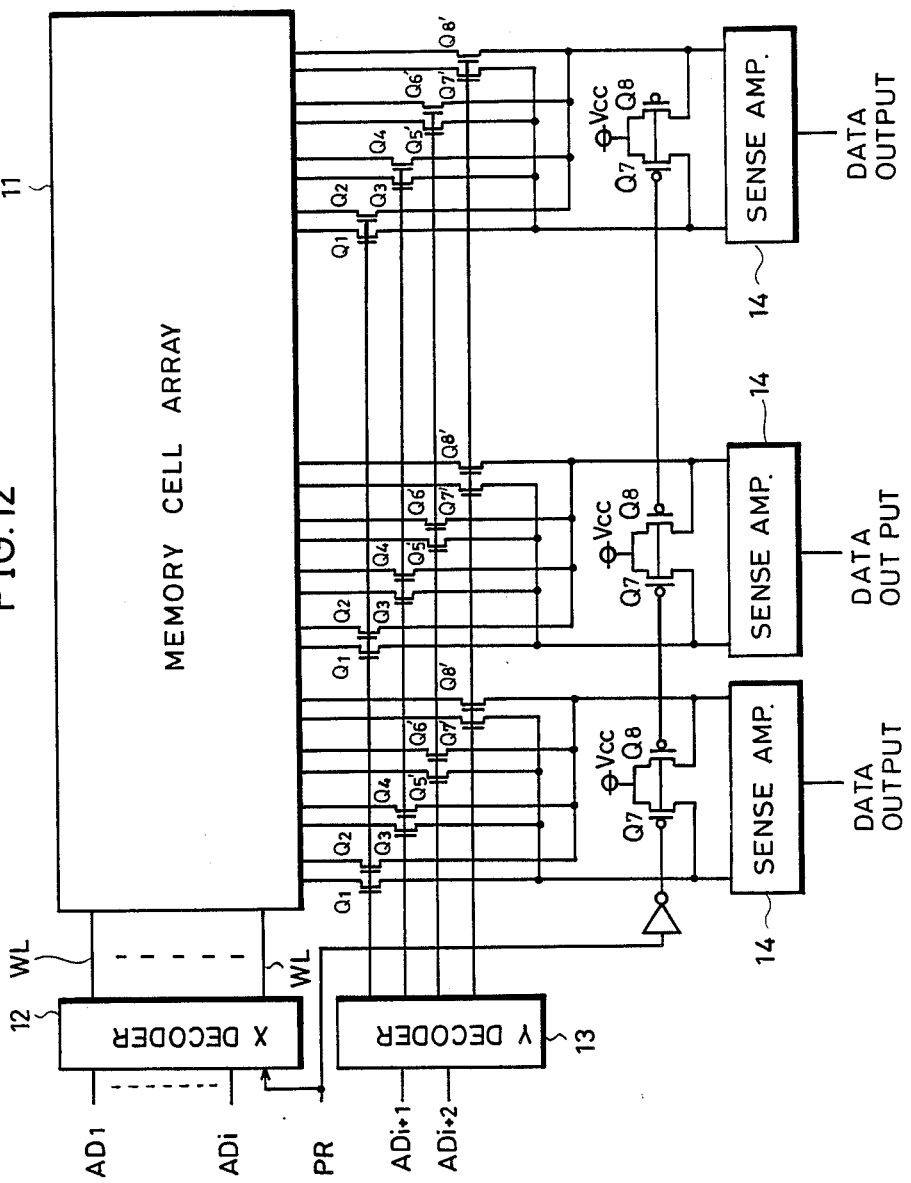
FIG. 12 is a schematic diagram showing a structure of a synchronous SRAM device in accordance with a further embodiment of the present invention.

In addition, although description was given of a SRAM device in which two sets of bit line pairs BL, $\overline{BL}$ are provided for each common data line pair CDL, $\overline{CDL}$ in the above described embodiment for the purpose of simplification, the present invention is not limited to this device. For example, four sets of bit line pairs BL, $\overline{BL}$ may be provided for each common data line pair CDL, $\overline{CDL}$ as shown in FIG. 12. It goes without saying that a plurality sets of bit line pairs BL, $\overline{BL}$ may be provided for each common data line pair CDL, $\overline{CDL}$.

As described above, according to the present invention, only the selected bit line is precharged, so that a wasteful power consumption due to unnecessary precharging can be prevented, whereby the power consumption can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous static random access memory, comprising:
   a plurality of word lines;
   a plurality of bit line pairs arranged so as to intersect said plurality of word lines;
   a plurality of memory cells at intersections of said word lines and said bit lines for storing information;
   a common data line pair;
   a source of precharge voltage at said common data line pair;
   first selection means for selecting any of said plurality of bit lines; and
   switch means for connecting said common data line pair to only said selected bit line pair and establishing a unidirectional precharge current flow path between said common data line pair and said selected bit line pair, said unidirectional precharge current flow path carrying precharge current only from said source at said common data line pair to said selected bit line pair.

2. A synchronous static random access memory according to claim 1, wherein
   each of said bit lines comprises a bit line pair from which information complementary to each other is read, and
   each of said common data lines comprises a common data line pair from which information complementary to each other is read.

3. A synchronous static random access memory according to claim 1, wherein
   said switch means comprises a transistor device coupled between said common data line and said source of precharge voltage, and said transistor device has a gate to receive a precharge signal.

4. A synchronous static random access memory according to claim 2, wherein
   said switch means comprises a first transistor device coupled between one of said common data line pair and said source of precharge voltage and a second transistor device coupled between the other of said common data line pair and said source of precharge voltage, and said first and second transistor devices comprise gates to receive a precharge signal.

5. A synchronous static random access memory according to claim 2, which further comprises
   equalizing means for equalizing the potential of said bit line pair at the time of precharging by said switch means.

6. A synchronous static random access memory according to claim 5, wherein
   said equalizing means comprises a transistor device coupled between said bit line pair.

7. A synchronous static random access memory according to claim 2, which further comprises
   level compensating means for bringing the potential of the common data line pair to said prescribed potential after the precharge by said switch means when the potential of said common data line pair does not fully reach said prescribed potential.

8. A synchronous static random access memory according to claim 7, wherein
   said level compensating means comprises a first transistor device coupled between one of said common data line pair and said source of precharge voltage and a second transistor device coupled between the other of said common data line pair and said source of precharge voltage, and
   said first transistor device has a gate connected to said the other of said common data line pair and said second transistor device has a gate connected to said one of said common data line pair.

9. A synchronous static random access memory according to claim 1, wherein
   said first selection means comprises:
   a plurality of transistor devices each of which is connected to said common data line and each bit line; and
   a decoder which receives an address signal and brings any of said plurality of transistor devices to a conductive state correspondingly.

10. A synchronous static random access memory according to claim 1, which further comprises:
    second selection means comprising a decoder which receives an address signal and brings any of said word lines to an active state corresponding to said address signal in response to the completion of said precharge by said precharging means.

11. A synchronous static random access memory according to claim 2, which further comprises
    a sense amplifier provided between said common data line pair for amplifying the potential difference thereof.

12. A synchronous static random access memory, comprising:
    a plurality of word lines;
    a plurality of bit line pairs arranged so as to intersect said plurality of word lines;
    a plurality of memory cells at intersections of said word lines and said bit lines for storing information;
    a common data line pair;
    first selection means for selecting any of said plurality of bit lines; and
    a source of precharge voltage at said common data line pair; an operating method, comprising the steps of:
    connecting said common data line pair to only said selected bit line pair; and
    establishing a unidirectional precharge current flow path between said common data line pair and said selected bit line pair, said unidirectional precharge current flow path carrying precharge current only from said source at said common data line pair to said selected bit line pair.

* * * * *